(12) United States Patent
Drapkin et al.

(10) Patent No.: US 7,932,785 B2
(45) Date of Patent: Apr. 26, 2011

(54) PHASE LOCK LOOP WITH CONTINUOUS CALIBRATION AND METHOD THEREFOR

(75) Inventors: Oleg Drapkin, Richmond Hill (CA); Grigori Temkine, Markham (CA); Mikhail Rodionov, Richmond Hill (CA); Michael Foxcroft, Toronto (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 10/924,145

(22) Filed: Aug. 23, 2004

(65) Prior Publication Data

US 2006/0038620 A1 Feb. 23, 2006

(51) Int. Cl.
*H03L 7/093* (2006.01)

(52) U.S. Cl. .................. 331/44; 331/16; 331/17

(58) Field of Classification Search ............ 331/16, 331/177 V, 44, 179; 327/147
See application file for complete search history.

(56) References Cited

U.S. PATENT DOCUMENTS

| | | | | |
|---|---|---|---|---|
| 5,175,884 A * | 12/1992 | Suarez | .......... | 455/260 |
| 5,382,922 A * | 1/1995 | Gersbach et al. | .......... | 331/1 A |
| 5,748,048 A * | 5/1998 | Moyal | .......... | 331/34 |
| 6,329,883 B1 * | 12/2001 | Pacourek | .......... | 331/17 |
| 7,009,456 B2 * | 3/2006 | Jasa et al. | .......... | 331/16 |
| 2005/0077970 A1 * | 4/2005 | Da Dalt et al. | .......... | 331/16 |

* cited by examiner

*Primary Examiner* — Robert Pascal
*Assistant Examiner* — James E Goodley
(74) *Attorney, Agent, or Firm* — Vedder Price PC

(57) ABSTRACT

A circuit includes a phase lock loop circuit and a continuous phase lock loop calibration circuit. The continuous phase lock loop calibration circuit is operatively coupled to the PLL circuit and produces a continuous calibration signal based on a reference voltage from a reference voltage circuit to calibrate the PLL circuit on a continuous basis.

8 Claims, 4 Drawing Sheets

US 7,932,785 B2

PHASE LOCK LOOP WITH CONTINUOUS CALIBRATION AND METHOD THEREFOR

FIELD OF THE INVENTION

The invention relates generally to clock generating circuits and more particularly the calibration of phase lock loop circuits.

BACKGROUND OF THE INVENTION

Many different types of integrated circuits and non-integrated circuits employ clock generating circuits such as phase lock loop circuits. Some examples of integrated circuits include, but are not limited to, graphics processors, central processing units, or any other suitable integrated circuits that employ clock generators. Manufacturing process variations, voltage supply variations and variations due to temperature changes, may cause a phase lock loop to go out of phase thereby causing clocked data to be lost (for example if the phase lock loop is the clock generator for a bus), or otherwise cause the lockup of other circuitry that depends upon a clock signal output by the phase lock loop circuit.

Although phase lock loop circuits employ a feedback structure that can adjust to, some degree, these variations, it can be difficult where for example a wide frequency range is desired. However, having a wide frequency range phase lock loop can also allow the introduction of noise since there is a wider frequency band. Accordingly, phase lock loop calibration circuits are known that attempt to calibrate the phase lock loop to calibrate an output signal to a suitable frequency range. However, these calibration circuits typically only operate during system resets or power ups.

FIG. 1 illustrates one example of such a known phase lock loop circuit 10 that employs discontinuous calibration, such as calibration upon reset but not during normal operation. As shown, a typical phase lock loop may include a phase detector 12 that receives a reference clock 14. The phase detector 12 outputs a difference in phase as a phase adjust signal 15 to a charge pump 16. The output of the charge pump 16 is a phase compensated signal 18 which is filtered by a low pass filter 20 before being applied to an analog adder 22. A controllable oscillator 24, such as a voltage controllable oscillator (VCO) receives a control signal output by the adder 22. The output of the controllable oscillator 24 is set at a desired frequency. A frequency divider 26 also receives an output frequency as part of a feedback loop L whose output is input to the phase detector 12.

The PLL circuit 10 compensates, for example for some level of process voltage and temperature (PVT) variations but may not be able to compensate enough depending on the structure of the PLL. To calibrate the PLL, firmware or other suitable logic detects a reset condition and the discontinuous calibration logic 30 sends a charge pump loop disable and reset calibration voltage signal 32 to cause the output of the charge pump 18 to be set to a fixed reference voltage through a suitable voltage divider network and switching array effectively disabling the feedback loop L. A digital-to-analog converter 34 also receives a calibration signal 36 which is output to an analog calibration signal 38 and serves as an input to the adder 22. As such, during reset conditions, the PLL is calibrated and then left to run freely during normal operations with no subsequent calibration. Although process variations due to voltage variations of the supply voltage and variations due to temperature may be compensated for the particular conditions during reset, the PLL circuit is not continuously calibrated during normal operation of the chip. Also the output voltage of the charge pump 16 can vary over time as well. The circuits 10 typically runs the voltage control oscillator through a range of settings using the calibration signal 38 and picks the best setting during reset. This is a feed forward approach. Moreover, if the PLL circuit serves as a clock generator for a data bus, address bus, control bus or any other bus, the bus typically must be in an idle condition so that data is not lost during the calibration procedure. For example, using the above technique, calibration cannot be done continuously because it requires the interruption of the feedback loop which would shut down a bus if the PLL circuit was continuously recalibrated.

Accordingly, a need exists to overcome one or more of the above limitations.

DETAILED DESCRIPTION OF THE DRAWINGS

The invention will be more readily understood in view of the following description when accompanied by the below figures and wherein like reference numerals represent like elements:

DETAILED DESCRIPTION OF THE PREFERRED EMBODIMENT

Briefly, a circuit includes a phase lock loop circuit and a continuous phase lock loop calibration circuit. The continuous phase lock loop calibration circuit is operatively coupled to the PLL circuit and produces a continuous calibration signal based on a reference voltage from a reference voltage circuit to calibrate the PLL circuit on a continuous basis. As such, there is no need for, among other things, the discontinuous calibration logic and/or a switching configuration and reference voltage configuration in a charge pump circuit to effect a discontinuous calibration of the PLL circuit. Also, variations caused by temperature changes or other changes can be continuously accommodated. Other advantages will be recognized by those of ordinary skill in the art.

In one embodiment, a DC reference voltage circuit which may be internal to an integrated circuit also containing the phase lock loop circuit and continuous phase lock loop calibration circuit, or may be external thereto, generates a reference voltage for the continuous phase lock loop calibration circuit. The phase lock loop circuit includes an adder, such as a voltage combining circuit, having a first input that receives the continuous calibration signal and a second input that receives a phase compensated signal and an output that is coupled to the controllable oscillator.

Figure 1:
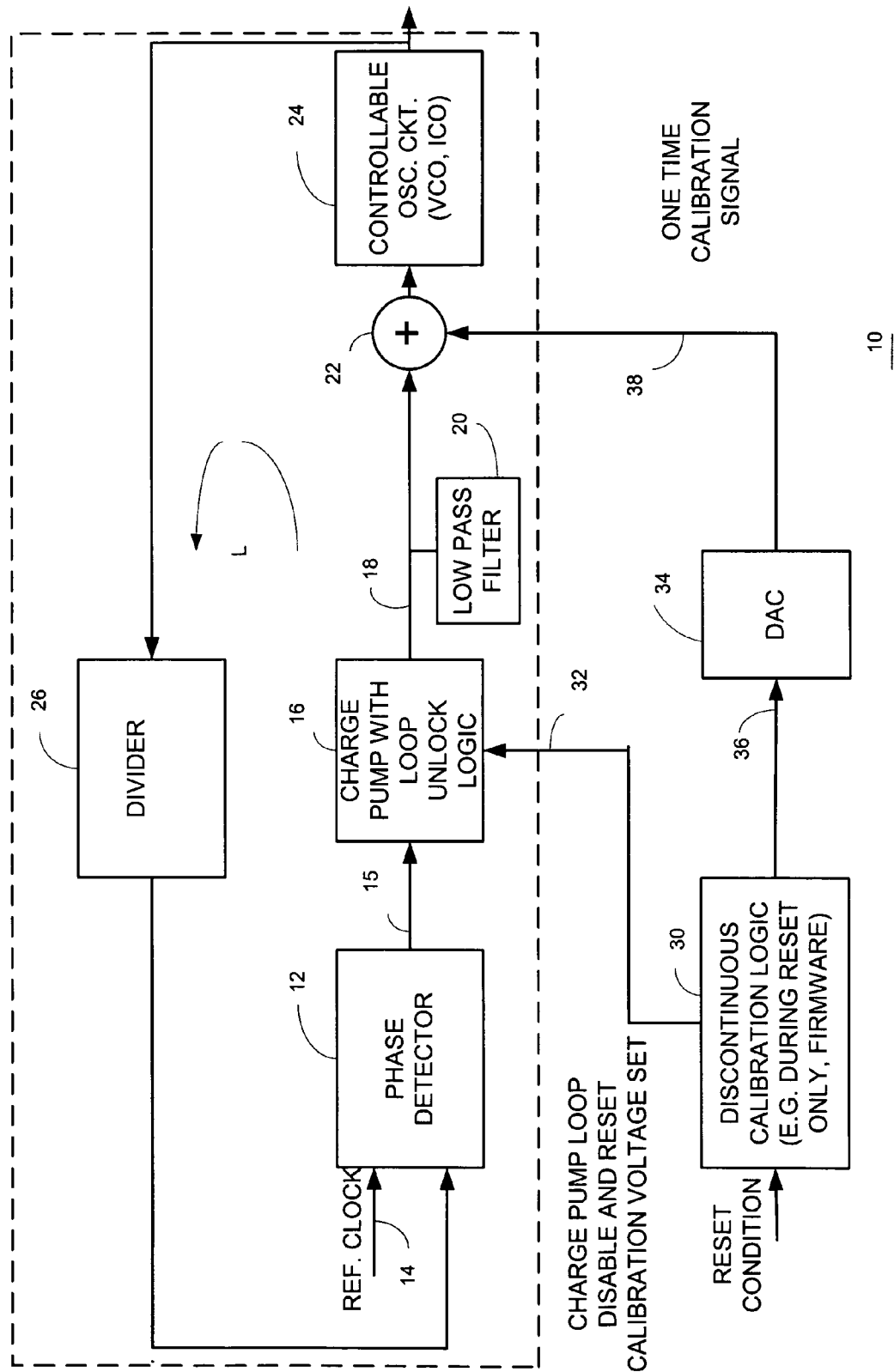
FIG. 1 is a block diagram illustrating one example of a phase lock loop with discontinuous calibration logic, as known in the art.
Figure 2:
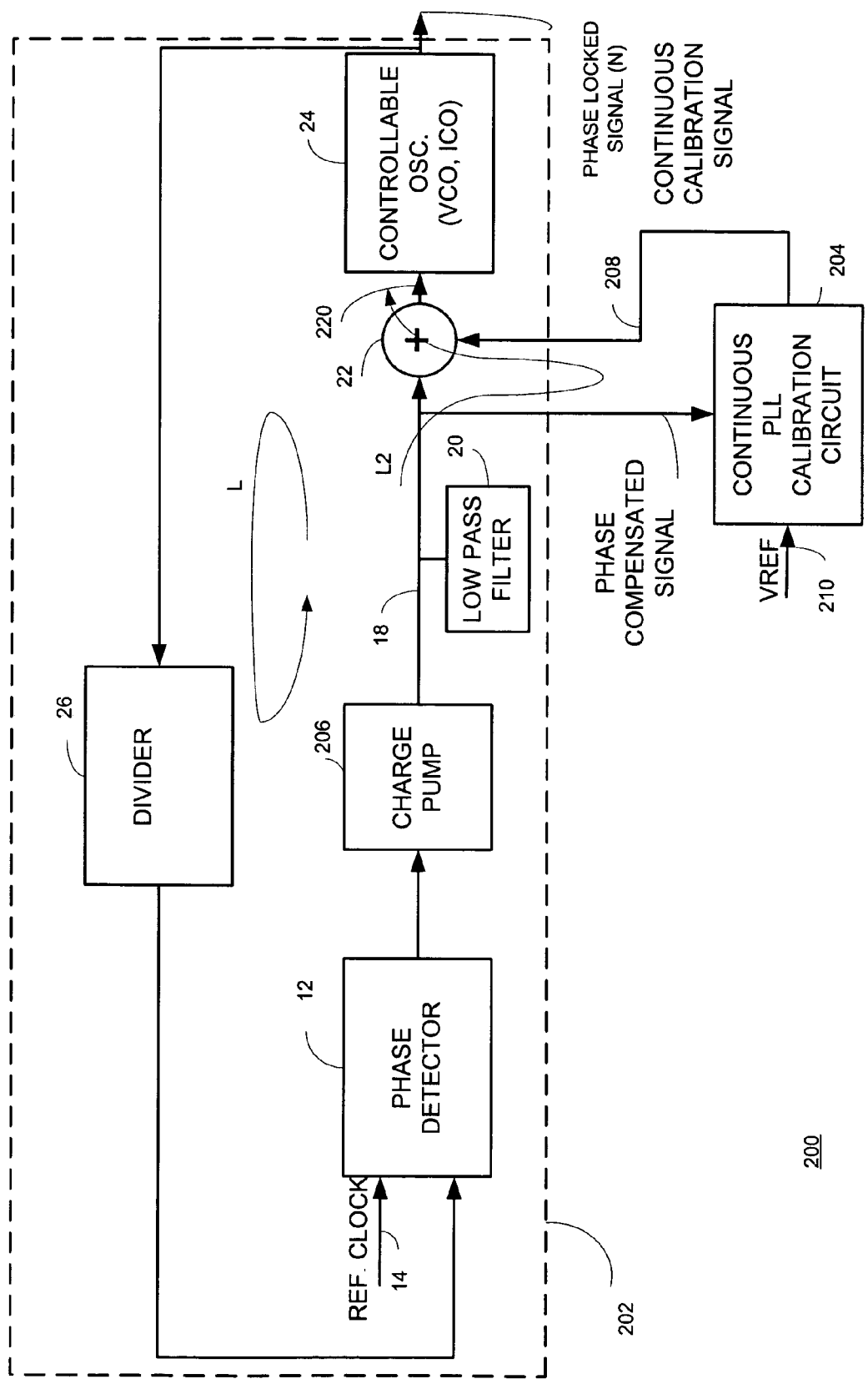
FIG. 2 is a block diagram illustrating one example of a circuit employing a phase lock loop with continuous phase lock loop calibration in accordance with one embodiment of the invention.

FIG. 2 illustrates one example of a circuit 200 that employs a phase lock loop circuit 202 and a continuous phase lock loop calibration circuit 204. The phase lock loop circuit may contain conventional phase lock loop elements but also includes a charge pump 206 that need not include phase lock loop unlock logic such as switching transistors and reference voltage generators as may be employed in the prior art. The continuous phase lock loop calibration circuit 204 is operatively coupled to the PLL circuit 202 and produces a continuous calibration signal 208 based on a reference voltage 210 from a reference voltage circuit to calibrate the PLL circuit 202 so that the PLL circuit 202 outputs an output frequency within a desired range even in view of PVT variations. The continuous calibration signal 208 serves as a type of offset signal to offset the phase compensated signal 18 generated by the phase lock loop L. The continuous PLL calibration circuit 204 is connected to provide a type of feedback loop, shown as L2.

In operation, the continuous PLL calibration circuit 204 receives the phase compensated signal 18 and effectively integrates changes as compared to a reference voltage 210. As such, the continuous PLL calibration circuit 204 generates a continuous calibration signal 208 as a type of slower offset to the more rapid changing phase compensated signal 18. The continuous calibration signal 208 and a phase compensated signal 18 are added by the adder 22 to provide a controllable oscillator control signal 220. As shown in this example, the controllable oscillator is a voltage controllable oscillator. However, it will be recognized that a current controllable oscillator may also be used with an appropriate continuous PLL calibration circuit 204.

Stated another way, the PLL circuit 202 includes the phase control loop L and the continuous phase lock loop calibration circuit 204 calibrates the phase control loop L to provide phase loop component operating point stabilization for components in the phase lock loop. For example, the charge pump 206 is operated in a suitable operating range due to the feedback provided by the continuous calibration signal.

The charge pump 206 has a gain and the continuous PLL calibration circuit has another gain. The continuous PLL calibration circuit 204 attempts to integrate any difference on the inputs of a differential amplifier over time to allow, for example, the design requirements of the charge pump 206 to be relaxed. For example, transistors within the charge pump only need to work within a narrow range of output voltages so that for example the current sources in the charge pump 206, as known in the art, may now be smaller. As such, with the embodiments shown in FIG. 2, the current sources such as the gates in the charge pump can be smaller which can result in lower parasitic capacitance and result in a faster operation. The circuit 204 also can help with the design of the low pass filter 20 to allow smaller filter elements to be employed. The loop L2 effectively stabilizes the gain of the loop L by producing an offset to compensate for variations of the signal as output from the low pass filter 20 and charge pump 206. At high frequencies for example, the circuits in path L dominate. In this example, the reference clock may be, for example, 100 megahertz clock signal from an external source and may generate an output signal having 2.5 gigahertz and may serve for example as a bus clock or any other suitable clock. However, it will be recognized that these frequencies and application are just used by way of example and not limitation.

Figure 3:
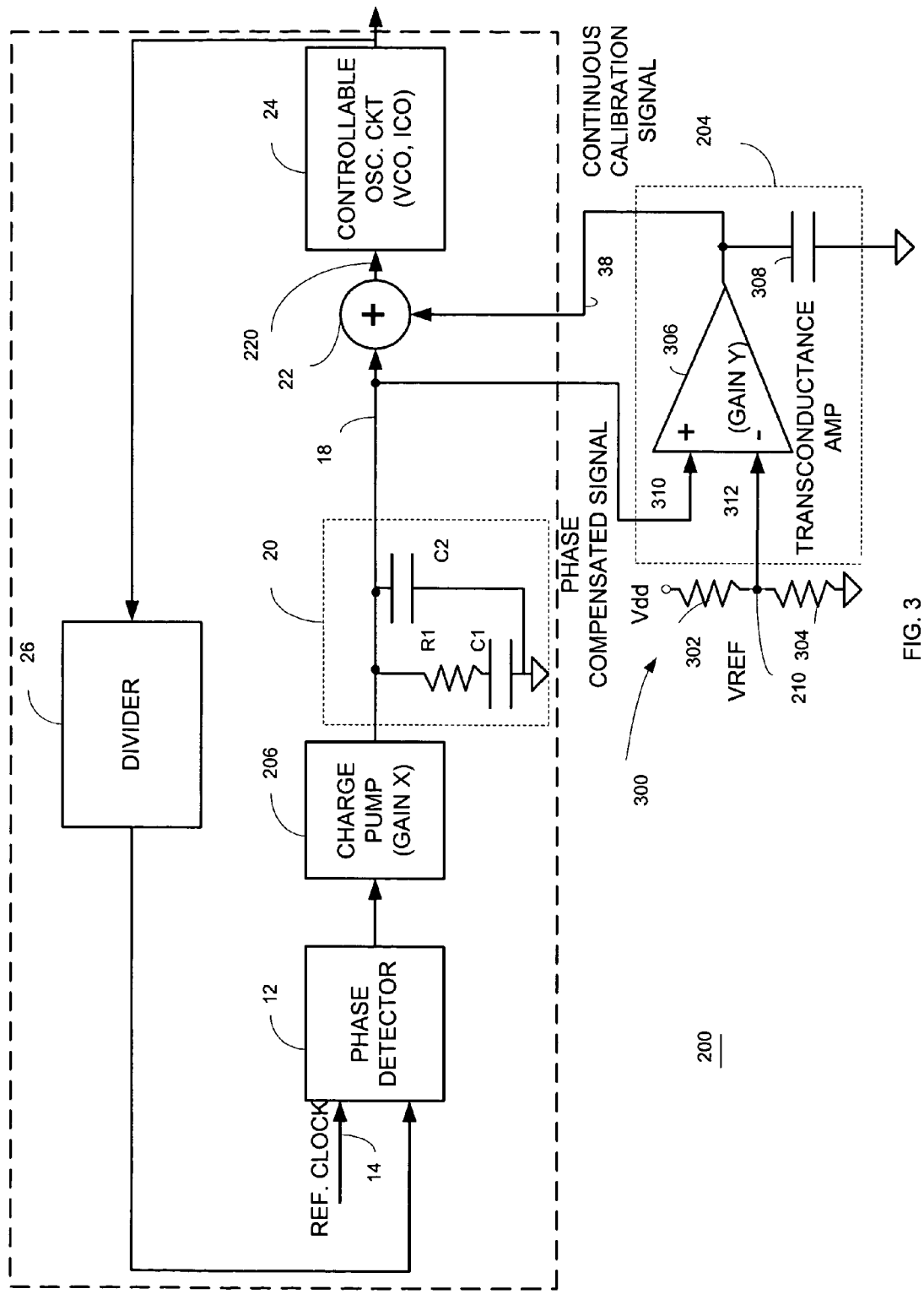
FIG. 3 is a block diagram illustrating in more detail the phase lock loop with continuous calibration shown in FIG. 2.

As shown in FIG. 3, the low pass filter of FIG. 2 may be implemented in any suitable fashion, and in this example is shown to include a resistor and capacitor R1C1 coupled in parallel with a capacitor C2. However, it will be recognized that any suitable low pass filter configuration may be employed. The circuit 200 also includes a DC reference voltage circuit 300 having, in this example, a resistor 302 and resistor 304 coupled to provide a voltage divider circuit. The resistors 302 and 304 are selected in this example to be equal to one half of VDD so that Vref=½ VDD. However, any suitable reference voltage level may be used.

The continuous phase lock loop calibration circuit 204 includes an integrator circuit having a transconductance amplifier 306 and a capacitive element 308 coupled to an output thereof. The transconductor amplifier 306 has a first input 310 that receives the phase compensated signal 18 from the charge pump and low pass filter and a second input 312 that receives the reference voltage 210. The output of the transconductance amplifier 306 is coupled to both the capacitive element 308 and to an input of the adder 22. The adder 22 also receives the phase compensated signal 18. The transconductance amplifier 306 has a gain and the charge pump circuit 206 also has a gain associated therewith. The charge pump 206 has an input that is coupled to an output of the phase detector and an output that provides the phase compensated signal 18. The controllable oscillator 24 outputs the phase locked signal N (output frequency) which is then fed back into the divider 22. As noted above, the continuous phase lock loop calibration circuit 204 produces the continuous calibration signal 38 for the adder 22. It will be recognized that the continuous PLL calibration circuit 204 may be any suitable circuit and that the integrator is one example of a suitable implementation.

Figure 4:
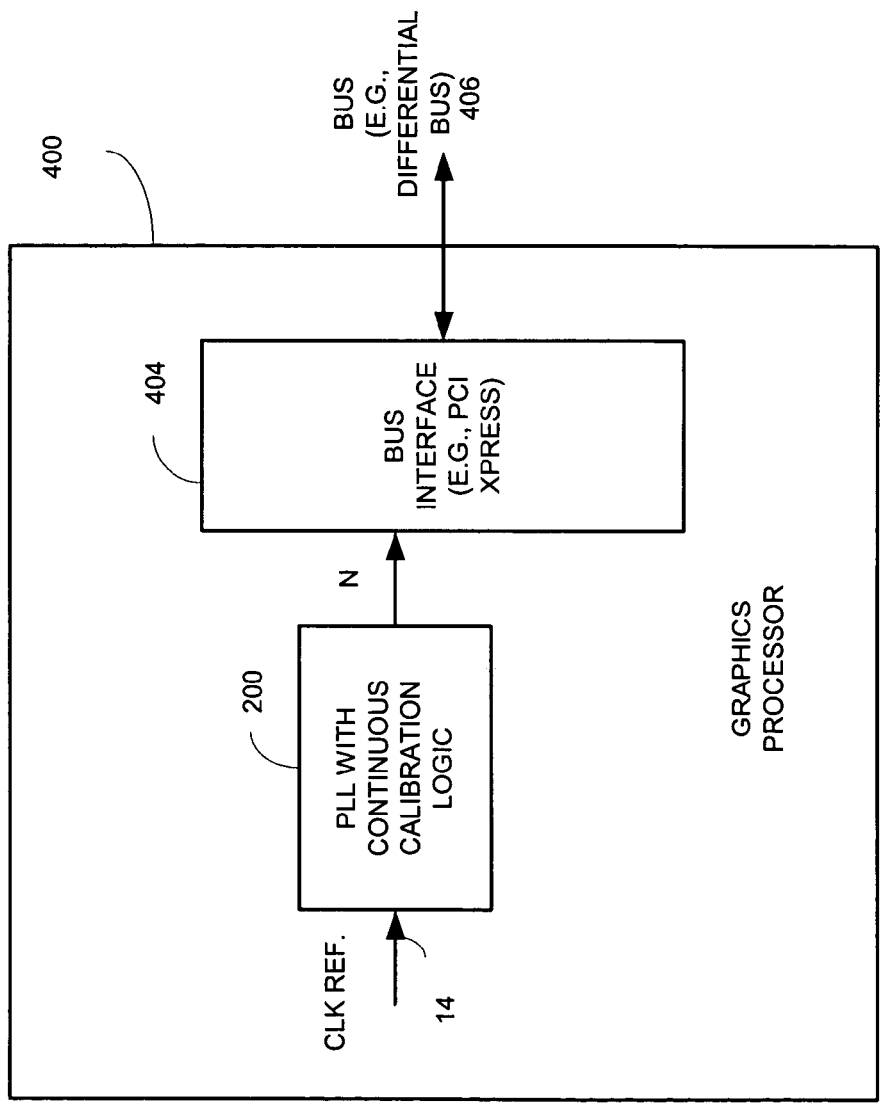
FIG. 4 is a block diagram illustrating a graphics processor employing an example of a phase lock loop circuit with continuous calibration such as that shown in FIG. 2 employed with a bus interface in accordance with one embodiment of the invention.

FIG. 4 illustrates one example of a graphics processor 400 employing the circuit 200 that outputs the phase locked signal N to a bus interface circuit 404. The bus interface circuit 404, as known in the art, may be coupled to a suitable bus 406 which may be for example a differential bus such as a PCI Express Bus, or any other suitable bus. The circuit 200 may be integrated on a single die or may be implemented as discrete components on a printed circuit board or multiple boards or in any other suitable manner.

As shown in this example, the graphics processor 400 in addition to the bus interface logic 404 may also include conventional graphics processing circuitry such as 3D rendering engines, display controllers, or any other suitable processing logic employed in graphics processors. For example, the graphics processor 400 may be of a type available from ATI Technologies Inc., Thornhill, Ontario, Canada, or any other suitable graphics processor. In this example, the PLL with continuous calibration logic 200 continuously provides a calibrated phase lock signal as, for example, a clock signal for the bus interface circuit 404 and becomes part of the bus 406 as the bus clock signal. However, it will be recognized that the circuit 200 may be employed in any suitable circuit or system.

The above circuit 200 allows the voltage controllable oscillator gain to be kept relatively low and at the same time can eliminate or substantially reduce variations caused by PVT as well as providing a circuit that may provide less noise. This may result, due in part to the VCO gain being able to be kept lower since the output frequency can be kept in a narrower range due to the continuous PLL calibration logic. Also, instead of a feed forward approach, the continuous phase lock loop calibration circuit is a type of continuous feedback calibration circuit that calibrates a phase control loop to provide phase loop component operating point stabilization for the components in the phase lock control loop. As such, the phase compensated signal output from the charge pump serves as input along with the reference voltage to an integrator circuit whose output serves as the continuous calibration signal which is added with the phase compensated signal on a continuous basis.

The above detailed description of the invention and the examples described therein have been presented for the purposes of illustration and description only and not by limitation. Also, the word "coupled" means directly or indirectly coupled to facilitate operation of the circuit. It is therefore contemplated that the present invention cover any and all modifications, variations or equivalents that fall within the spirit and scope of the basic underlying principles disclosed above and claimed herein.

What is claimed is:

1. A circuit comprising:
a phase lock loop (PLL) circuit comprising a controllable oscillator;
a continuous phase lock loop calibration circuit, coupled to receive a phase compensated signal, that is operatively coupled to the PLL circuit and operative to produce a continuous and non-stepped calibration signal based on a reference voltage from a reference voltage circuit to calibrate the PLL circuit continually and provide an output frequency within a desired frequency range wherein generating the continuous and non-stepped calibration signal includes integrating changes between the reference voltage and the phase compensated signal; and
wherein the phase lock loop circuit includes an adder having a first input that receives the continuous calibration signal and a second input that receives the phase compensated signal, and includes an output operatively coupled to the controllable oscillator.

2. The circuit of claim 1 including a DC reference voltage circuit that generates the reference voltage for the continuous phase lock loop calibration circuit.

3. The circuit of claim 1 wherein the PLL circuit includes a phase control loop and wherein the continuous phase lock loop calibration circuit calibrates the phase control loop to provide phase loop component operating point stabilization.

4. A circuit comprising:
a phase lock loop (PLL) circuit that includes at least:
a phase detector with a first input, a second input and an output, the first input operatively coupled to a reference clock signal;
a charge pump circuit having an input operatively coupled to an output of the phase detector and an output that provides a phase compensated signal;
an adder operatively coupled to receive the phase compensated signal;
a controllable oscillator circuit having an input operatively coupled to receive an output signal from the adder, and an output that provides a phase locked signal; and
a phase divider circuit, operatively coupled to the output of the controllable oscillator and to the second input of the phase detector;
a continuous phase lock loop calibration circuit having a reference voltage generating circuit, and operatively coupled to receive the phase compensated signal, the continuous phase lock loop calibration circuit operative to produce a continuous and non-stepped calibration signal based on a reference voltage from a reference voltage generating circuit to calibrate the PLL circuit continually and provide an output frequency within a desired frequency range wherein generating the continuous and non-stepped calibration signal includes integrating changes between the reference voltage and the phase compensated signal; and
wherein the adder has a first input that receives the continuous calibration signal and a second input that receives the phase compensated signal, and includes an output operatively coupled to an input of the controllable oscillator circuit.

5. A graphics processor comprising:
bus interface logic;
a phase lock loop (PLL) circuit, operatively coupled to the bus interface logic, that includes at least:
a phase detector with a first input, a second input and an output, the first input operatively coupled to a reference clock signal;
a charge pump circuit having an input operatively coupled to an output of the phase detector and an output that provides a phase compensated signal;
an adder operatively coupled to receive the phase compensated signal;
a controllable oscillator circuit having an input operatively coupled to receive an output signal from the adder, and an output that provides a phase locked signal; and
a phase divider circuit, operatively coupled to the output of the controllable oscillator and to the second input of the phase detector;
a continuous phase lock loop calibration circuit having a reference voltage generating circuit, and operatively coupled to receive the phase compensated signal, the continuous phase lock loop calibration circuit operative to produce a continuous and non-stepped calibration signal based on a reference voltage from a reference voltage generating circuit to calibrate the PLL circuit continually and provide an output frequency within a desired frequency range by integrating changes between the reference voltage and the phase compensated signal; and
the adder operative to combine the phase compensated signal with the continuous calibration signal to produce the output signal for the controllable oscillator.

6. A method for compensating a PLL circuit comprising:
receiving a phase compensated signal;
generating a continuous and non-stepped calibration signal in response to the phase compensated signal and a reference voltage; and
combining the phase compensated signal with the continuous calibration signal to produce a control signal for a controllable oscillator and provide an output frequency within a desired frequency range;
wherein generating a continuous calibration signal includes integrating changes between the reference voltage and the phase compensated signal.

7. A circuit comprising:
a phase lock loop (PLL) circuit;
a continuous phase lock loop calibration circuit that is operatively coupled to the PLL circuit and operative to produce a continuous and non-stepped calibration signal based on a reference voltage from a reference voltage circuit to calibrate the PLL circuit continually; and
an integrator circuit having a transconductance amplifier and a capacitive element wherein the transconductance amplifier has a first input operatively coupled to receive a phase compensated signal output from a charge pump circuit, a second input operatively coupled to receive the reference voltage and an output operatively coupled to both the capacitive element and an input of an adder that also has an input that receives the phase compensated signal.

8. A circuit comprising:
a phase lock loop (PLL) circuit that includes at least:
a phase detector with a first input, a second input and an output, the first input operatively coupled to a reference clock signal;

a charge pump circuit having an input operatively coupled to an output of the phase detector and an output that provides a phase compensated signal;

an adder operatively coupled to receive the phase compensated signal;

a controllable oscillator circuit having an input operatively coupled to receive an output signal from the adder, and an output that provides a phase locked signal; and a phase divider circuit, operatively coupled to the output of the controllable oscillator and to the second input of the phase detector;

a continuous phase lock loop calibration circuit having a reference voltage generating circuit, and operatively coupled to receive the phase compensated signal, the continuous phase lock loop calibration circuit operative to produce a continuous and non-stepped calibration signal based on a reference voltage from a reference voltage generating circuit to calibrate the PLL circuit continually; and an integrator circuit having a transconductance amplifier and a capacitive element wherein the transconductance amplifier has a first input operatively coupled to receive the phase compensated signal output from the charge pump circuit, a second input operatively coupled to receive the reference voltage and an output operatively coupled to a capacitive element and that provides the phase compensated signal to the adder.

* * * * *